(12) United States Patent
Yamashita et al.

(10) Patent No.: US 6,191,466 B1
(45) Date of Patent: Feb. 20, 2001

(54) SEMICONDUCTOR DEVICE CONTAINING A DIODE

(75) Inventors: Yasunori Yamashita; Tomohide Terashima; Fumitoshi Yamamoto, all of Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/395,939

(22) Filed: Sep. 14, 1999

(30) Foreign Application Priority Data

Apr. 12, 1999 (JP) .................................................. 11-104299

(51) Int. Cl.[7] .................................................. H01L 21/336
(52) U.S. Cl. .......................... 257/481; 257/551; 257/603; 257/605
(58) Field of Search .................................. 257/481, 551, 257/175, 199, 603, 605, 606

(56) References Cited

U.S. PATENT DOCUMENTS

| | | | |
|---|---|---|---|
| 5,477,078 | * 12/1995 | Beigel et al. | 257/606 |
| 5,578,862 | * 11/1996 | Fujii et al. | 257/547 |
| 5,631,493 | * 5/1997 | Pezzani | 257/551 |

FOREIGN PATENT DOCUMENTS

| | | | |
|---|---|---|---|
| 0086210 B1 | * 10/1985 | (EP) . | |
| 361270875 | * 12/1986 | (JP) . | |
| 402150072 | * 6/1990 | (JP) . | |
| 402216873 | * 8/1990 | (JP) . | |
| 2-146458 | 12/1990 | (JP) . | |
| 10-74958 | 3/1998 | (JP) . | |

OTHER PUBLICATIONS

"Physics and Technology of Semiconductor Devices", by A.S. Grove, McGraw–Hill Book Company, pp. 204–205.

* cited by examiner

Primary Examiner—Olik Chaudhuri
Assistant Examiner—Hoai Pham
(74) Attorney, Agent, or Firm—McDermott, Will & Emery

(57) ABSTRACT

A semiconductor device which has few peripheral element malfunctions and superior performance is obtained. The semiconductor device includes a p-type buried layer on a main surface of a semiconductor substrate, an n-type cathode region provided on the p-type buried layer, and a p-type anode region in contact with the side surface of the n-type cathode region, the p-type buried layer being higher than the p-type anode region in acceptor content, and the p-type buried layer being in contact with the bottom surfaces of the anode and cathode regions.

9 Claims, 18 Drawing Sheets

SEMICONDUCTOR DEVICE CONTAINING A DIODE

BACKGROUND OF THE INVENTION

1. Field of the Invention

The present invention relates to semiconductor devices and more particularly to a diode which prevents the flow of electrons into a peripheral element on a semiconductor substrate and which is superior, for example, in the slope ($\Delta I/\Delta V$) of forward bias current.

2. Description of the Background Art

Referring to FIG. 34, a conventional diode includes an n-type buried semiconductor layer with a high donor content (which may be referred to as an "$n^+$ buried layer" hereinafter) 503 which is formed on a p-type semiconductor substrate (hereinafter, referred to as a "p substrate") 504. An n-type semiconductor region as a cathode region (which may be referred to as an "n-type cathode region" hereinafter) 501 is formed on $n^+$ buried layer 503, and a p-type semiconductor region as an anode region (which may be referred to as a "p-type anode region" hereinafter) 502 is formed in the vicinity of the n-type cathode region to be in contact with p substrate 504. It is noted that diodes including the above described diode generally have a cylindrical p-type anode region which is formed on the side surface of the central n-type cathode region. Therefore, the two right and left p-type anode regions in FIG. 34 constitute the longitudinal section of one cylindrical anode.

The operation principle of the above described diode will be described in the following. The energy band of a junction between p-type anode region 502 and n-type cathode region 501 is shown in FIG. 35. In FIG. 35, a potential barrier Vo is caused at the boundary of the p-type anode region and the n-type cathode region, resulting in an energy difference eVo. The energy band chart is represented for an electron. Thus, the energy difference eVo has to be exceeded in order for electrons produced in the n-type cathode region to flow into the p-type anode region.

In the chart, Ec is energy at the bottom of a conduction band, Ev is energy at the top of a valence band, Efn is chemical potential (Fermi-energy) in the n-type cathode region, and Efp is chmical potential in the p-type anode region.

If voltage is externally applied to a diode in the energy state shown in FIG. 35, the energy band changes as shown in FIG. 36 or 37. FIG. 36 shows a case in which positive voltage, relative to n-type cathode region 501, is applied to p-type anode region 502 (forward bias), indicating that the potential barrier of a depletion layer decreases by an applied voltage $V_A$ from the level of FIG. 35 to e(Vo-Va). It facilitates hole movement from p-type anode region 502 to n-type cathode region 501 and electron movement from n-type cathode region 501 to p-type anode region 502. Thus, current flows from p-type anode region 502 to n-type cathode region 501.

On the other hand, FIG. 37 shows a case in which negative voltage, relative to n-type cathode region 501, is applied to p-type anode region 502 (reverse bias), indicating that the potential barrier of a depletion layer increases by applied voltage $V_A$ from the level of FIG. 35 to e(Vo+Va). It reduces the probability of hole movement from p-type anode region 502 to n-type cathode region 501 and electron movement from n-type cathode region 501 to p-type anode region 502. Thus, the amount of flowing current is very small. Semiconductor devices of the above described type have been improved to have the reverse bias voltage higher than an actual used voltage and widely used as clamp diodes. In other words, the semiconductor devices are used as diodes for circuit protection in case reverse bias surge voltage, for example, which exceeds an actual used voltage is suddenly applied to cathodes.

In the semiconductor device having the above described structure, application of positive voltage, relative to n-type cathode region 501, to p-type anode region 502 causes electrons to move from n-type cathode region 501 to p-type anode region 502. Electrons also move from n-type cathode region 501 to p substrate 504. Therefore, electrons flow from p substrate 504 to an element provided in the vicinity of the diode on the semiconductor substrate, contributing a malfunction of the peripheral element.

In order to solve this problem, a proposal was made to surround the entire side and bottom surfaces of an n-type cathode region by a $p^+$ buried semiconductor layer (Japanese Utility Model Laying-Open No. 2-146458). It was found out, however, that the problems as described below occur depending on application when a region which originally functions as an anode is made a $p^+$ region with a high acceptor content. The problems are: (a) when forward bias voltage is applied, the slope ($\Delta I/\Delta V$), that is, a current increase for a voltage increase is small in lower voltage, that is, the diode rectification does not occur steeply when positive voltage is applied; and (b) electrons do not move easily to the anode region and therefore the controllability of a diode by diode voltage becomes insufficient.

The following proposal was made as a semiconductor device which avoids the problems of (a) and (b) and prevents the flow of electrons into a peripheral element. In other words, two types of buried semiconductor layers, that is, p and n type buried semiconductor layers are provided between a substrate and a diode formation layer, and the resistance of a guiding region which extends upward from each of the two types of buried semiconductor layers is adjusted so as to form the reverse bias or equal potential relations between the n-type buried semiconductor layer and the p-type buried semiconductor layer (Japanese Patent Laying-Open No. 10-74958).

However, the above described structure cannot prevent the flow of electrons from the cathode through the guiding region to the semiconductor substrate, which bypasses the buried semiconductor layers. Further, adapting the above described structure makes it difficult to miniaturize semiconductor devices. Therefore, the above described structure is insufficient to prevent the flow of electrons into semiconductor substrates in the latest miniaturized and lower-voltage semiconductor devices.

SUMMARY OF THE INVENTION

Therefore, an object of the present invention is to provide a semiconductor device which is easily miniaturized and achieves various properties as a diode (such as the steep slope ($\Delta I/\Delta V$) at the time of forward bias voltage application) and also prevents the flow of electrons into a substrate.

The semiconductor device of the present invention includes a p-type buried semiconductor layer provided at a main surface of a semiconductor substrate, a cathode region formed of an n-type semiconductor layer provided on the p-type buried semiconductor layer, and an anode region formed of a p-type semiconductor layer formed to surround and be in contact with the side surface of the cathode region, the p-type buried semiconductor layer being higher than the anode region in acceptor content, and the p-type buried semiconductor layer being in contact with the bottom surfaces of the cathode region and the anode region.

According to the above described structure, the direct flow of electrons into the semiconductor substrate can be prevented by a conduction band of the buried semiconductor layer, which forms on a high potential barrier resulting from a high acceptor content ($p^+$). Meanwhile, the acceptor content of the p-type anode region is lower than that of the buried semiconductor layer, and therefore the potential barrier of a conduction band in the p-type anode region is not high enough to be able to ignore the inflow of electrons. Thus, the slope ($\Delta I/\Delta V$) for lower voltage at the time of forward bias voltage application can be increased. In the semiconductor device of the present invention, therefore, the acceptor content of the anode region is set lower than that of the p-type buried semiconductor layer which is aimed at preventing the inflow of electrons. Thus, the proportion of electrons flowing toward the anode region is high in electrons produced in the cathode region, and many electrons reaches an anode electrode and contribute to the current which flows in the circuit. Therefore, the slope ($\Delta I/\Delta V$) of forward bias current can be increased. Since few electrons flow in the case of reverse bias because of the potential barrier which increases in proportion to the reverse bias voltage, the diode rectification can be caused more steeply by the above described effects.

In the above described semiconductor device, the amount of electrons which flow into the p-type buried semiconductor layer with a high acceptor content is very small because of the high potential barrier and, even if they flow into the p-type buried semiconductor layer, the electrons recombine with holes and disappear. Since many electrons emitted from the cathode reach the anode electrode via the p-type anode region, the diode for rectification and the like can be controlled easily by voltage applied to the anode electrode.

In the above described semiconductor device, it is preferred that the acceptor content of the p-type buried layer is high enough to be able to practically ignore the inflow of electrons emitted from the cathode region.

Therefore, the inflow of electrons from the n-type cathode region can reliably be prevented, and a peripheral element malfunction can be prevented.

In the above described semiconductor device, it is preferred that the anode region extends on the bottom surface of the cathode region to cover the bottom surface of the cathode region, and the entire bottom surface of the anode region is in contact with the p-type buried semiconductor layer.

Since the n-type cathode region and the p-type anode region are in contact with each other not only at the side surface of the n-type cathode region but at the bottom surface of the n-type cathode region, the interface increases between the n-type cathode region and the p-type anode region which has a low acceptor content, facilitating the inflow of electrons. Therefore, the slope ($\Delta I/\Delta V$) for lower voltage at the time of forward bias voltage application can be made much larger than that of a semiconductor device in which the p-type buried semiconductor layer is in contact with the cathode bottom surface. Since almost all the electrons emitted from the n-type cathode region flow into the p-type anode region, the controllability of the diode for rectification and the like by voltage applied to the p-type anode region can further be improved. Miniaturization of the semiconductor device can further be promoted by forming the n-type cathode region in the p-type anode region as described above.

The above described semiconductor device further includes an n-type semiconductor region formed to surround and be in contact with the side surface of the anode region, and a p-type semiconductor region formed in contact with the n-type semiconductor region in the circumferential direction and having an equal potential to that of the n-type semiconductor region, the p-type buried semiconductor layer preferably having width and arrangement which cause itself to be in contact at least with the entire bottom surfaces of the cathode region and the anode region.

According to the above described structure, application of voltage, which is higher than that of the cathode electrode, to the anode electrode causes electrons which flow from the n-type cathode semiconductor region directly toward the semiconductor substrate to be stopped since the electrons cannot move to the conduction band of the $p^+$ buried layer which forms a high potential barrier. Meanwhile, electrons which attempt to bypass the $p^+$ buried semiconductor layer enter the p-type anode region and then move to the n-type semiconductor region on account of the parasitic bipolar effect. Here, the parasitic bipolar effect is a bipolar effect which is caused in a different aspect from its original purpose and, in this aspect, it is the bipolar effect of flowing electrons into the n-type semiconductor region as a collector when electrons enter the anode region as a base. When electrons flow into the n-type semiconductor region, a potential difference is caused between the n-type semiconductor region and the p-type semiconductor region if they are not connected. Since the n and p type semiconductor regions are connected to have an equal potential, however, holes move from the p-type semiconductor region to the n-type semiconductor region so as not to cause a potential difference. Therefore, electrons which have flowed from the p-type anode region to the n-type semiconductor region recombine with the holes emitted from the p-type semiconductor region and disappear.

As a result, any electrons which have flowed from the n-type cathode region toward the periphery will not flow into the semiconductor substrate, and a peripheral element malfunction cannot be caused. Since the acceptor content of the p-type anode region is not high enough to be able to substantially prevent the flow of electrons into the p-type anode region by its potential barrier, the contribution of the above mentioned electrons is not small in the current at the time of forward bias application. Therefore, the slope ($\Delta I/\Delta V$) for lower voltage at the time of forward bias voltage application can be increased. Since many electrons avoid the $p^+$ buried layer forming a high potential barrier due to the high acceptor content and flow toward the p-type anode region, the controllability of the diode for rectification by the anode voltage is improved.

It is noted that "be in contact at least with the cathode region and the anode region" includes a case where the p-type buried semiconductor layer extends even its outside.

In the above described semiconductor device, it is preferred that the anode region extends on the bottom surface of the cathode region to cover the bottom surface of the cathode region.

Since the n-type cathode region and the p-type anode region have a junction surface not only at the side surface but at the cathode bottom surface, the similar voltage-current property and the like can be maintained even after the cathode region and the anode region are miniaturized. Furthermore, electrons which attempt to flow from the cathode to the periphery will not flow into the semiconductor substrate.

Since the interface increases between the n-type cathode region and the anode region which has a low acceptor content causing most electrons to enter, the slope ($\Delta I/\Delta V$) for lower voltage at the time of forward bias voltage application can further be increased compared with a semiconductor device in which the $p^+$ buried layer is in contact with the cathode bottom surface. Since almost all the electrons emitted from the n-type cathode region flow toward the p-type anode region, the controllability of the diode for rectification and the like by a voltage applied to the p-type anode region can further be increased.

In the above described semiconductor device in which the p-type anode region exists even immediate under the n-type cathode region, it is preferred that the n-type semiconductor region extends on the bottom of the anode region to cover the bottom of the anode region.

According to the above described structure, the flow of electrons into the substrate can be prevented, and miniaturization of the semiconductor device can further be promoted. Further, ($\Delta I/\Delta V$) and the controllability can be improved.

In the above described semiconductor device in which the n-type semiconductor region is on the bottom of the anode region, it is preferred that the p-type semiconductor region extends on the bottom of the n-type semiconductor region to cover the bottom surface of the n-type semiconductor region.

The above described semiconductor device having such a structure can be miniaturized more compared with a semiconductor device in which the anode region and the n-type semiconductor region are arranged to contact not only at the side surface but at the bottom surface of the cathode. Furthermore, electrons which had flowed from the cathode region toward the periphery will not flow into the semiconductor substrate.

In the above described semiconductor device in which the n and p semiconductor regions of the equal potential are formed, it is preferred that the p-type semiconductor region is formed to overlap the n-type semiconductor region, in plan view.

By thus forming the n and p type semiconductor regions to overlap each other in plan view, the semiconductor device can further be miniaturized. According to the overlapped manner, the interface area between the n and p type semiconductor regions can be increased to improve the sensitivity of hole generation in the p-type semiconductor region.

The above described semiconductor device in which the n and p semiconductor regions of the equal potential are formed further preferably includes an n-type buried semiconductor layer formed in the substrate to cover and be in contact with the side surface and bottom surface of the p-type buried semiconductor layer in the substrate, and the n-type buried layer extends to be contact with the bottom surface of the n-type semiconductor region.

According to the above described structure, electrons flow into the n-type buried semiconductor layer if there is any electron which passes through the $p^+$ type buried semiconductor layer. However, the n-type buried semiconductor layer, the n-type semiconductor region and the p-type semiconductor region are electrically connected and given the condition that they assume the equal potential. In order to have the equal potential, holes are emitted from the p-type semiconductor region to the n-type semiconductor region and the n-type buried semiconductor layer, and the holes and electrons recombine and disappear. Therefore, the flow of electrons which vertically pass through the $p^+$ buried layer is prevented more strongly.

A method of manufacturing a semiconductor device of the present invention includes the steps of forming a p-type buried semiconductor layer at a main surface of a semiconductor substrate by implanting p-type impurities into the main surface and carrying out heating, forming an n-type semiconductor layer on the p-type buried semiconductor layer and the semiconductor substrate therearound, forming a cathode region by implanting n-type impurities into a first region of the n-type semiconductor layer, which corresponds to the central region of the p-type buried semiconductor layer, and forming an anode region by implanting p-type impurities into a second region of the n-type semiconductor layer, which adjacently surrounds the first region and which is located on the p-type buried semiconductor layer, so that the anode region is lower than the p-type buried semiconductor layer in p conductive impurity content.

According to the above described manufacturing method, a semiconductor device can be manufactured which does not cause a peripheral element malfunction due to the flow of electrons into the semiconductor substrate, and the device can be superior in various diode properties.

The above described method of manufacturing a semiconductor device further includes the steps of forming an n-type semiconductor region by implanting n-type impurities into a third region of the n-type semiconductor layer, which adjacently surrounds the outer side surface of the second region, forming a p-type semiconductor region by implanting p-type impurities into a fourth region which extends in the circumferential direction of the third region and overlaps or is adjacent to the third region, and wiring the third and fourth regions, the p-type buried semiconductor layer preferably formed to be in contact at least with the entire bottom surfaces of the first and second regions.

By providing the n-type semiconductor region and the p-type semiconductor region which have an equal potential condition at the outer periphery of the anode region, electrons which bypass the p-type buried semiconductor layer can be disappeared, and a peripheral element malfunction can be prevented more reliably. It is noted that "be in contact at least with the entire bottom surface of the first and second regions" includes a case where the p-type buried semiconductor layer is in contact with the bottom surfaces of the outer third and fourth regions.

In the above described method of manufacturing a semiconductor device, it is preferred that the p-type buried semiconductor layer is formed on an n-type buried semiconductor layer after the n-type buried semiconductor layer is formed to have its periphery in contact with the bottom surface of the n-type semiconductor region which is formed in a subsequent process.

According to the above described manufacturing method, any electrons which pass through the p-type buried semiconductor layer can be disappeared in the n-type buried semiconductor layer. Therefore, a peripheral element malfunction due to the inflow of electrons can be prevented more reliably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in the following with respect to the drawings.

First Embodiment

Figure 1:
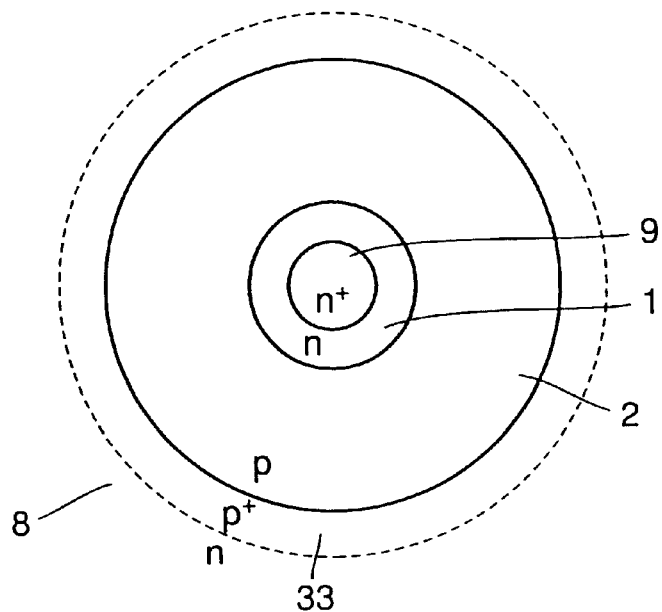
FIGS. 1 and 2 are plan and sectional views of a semiconductor device in a first embodiment of the present invention.
Figure 2:
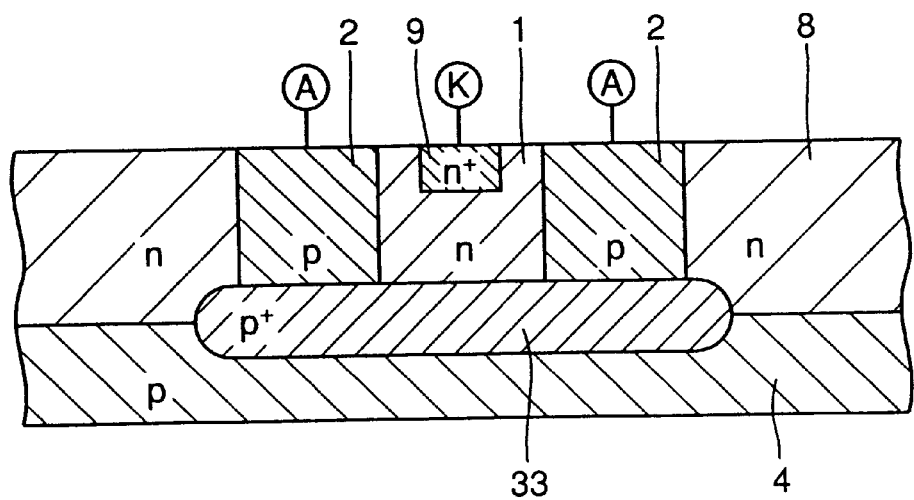

In a semiconductor device in a first embodiment shown in FIGS. 1 and 2, a silicon single crystal substrate doped with p-type impurities (hereinafter, referred to as a "p substrate") is used as a semiconductor substrate. Compound semiconductors formed of Ge single crystal, GaAs, InSb and AlAs other than silicon single crystal may also be used. Further, a polycrystal or amorphous semiconductor other than single crystal can be used according to application. Although the plan shape of a cathode in the semiconductor device is circular, it may be rectangular, oval or the like. Since the rectangular cathode shape causes uneven electron flow at a corner, however, the cathode is preferably circular, oval or the like.

On p substrate 4, a p$^+$ type buried semiconductor layer (p$^+$ buried layer) 33 is provided which has an acceptor content high enough to prevent the inflow of electrons emitted from an n-type cathode region and, on the p$^+$ buried layer, an n-type epitaxial growth layer 8 is formed. That is, p$^+$ buried layer 33 is formed between p substrate 4 and n-type epitaxial growth layer 8. In the n-type epitaxial growth layer, donor impurities or acceptor impurities are implanted into respective regions to form an n-type cathode region 1 and a p-type anode region 2. According to application, the n-type epitaxial growth layer may not have to be formed by epitaxial growth but can merely be replaced by an n-type semiconductor layer which does not have a continuous lattice arrangement. The acceptor content of anode region 2 is low enough to be able to facilitate diode rectification, for example.

P-type anode region 2 is arranged around n-type cathode region 1. A method of manufacturing the semiconductor device will be described in detail in a second embodiment.

When positive voltage relative to n-type cathode region 1 is applied to p-type anode region 2 in this semiconductor device, electrons move from n-type cathode region 1 to p-type anode region 2 and p$^+$ buried layer 33. A diffusion current I due to the electron movement is as shown in the following expression (1).

$$I = -qDn^2/[N_A L_n \cdot [\exp(qV_F/kT) - 1]A_J] \quad (1)$$

Here, I is an electron current, q is an electron charge amount, D is an electron diffusion coefficient, n is an intrinsic carrier density, $N_A$ is an acceptor impurity content, $L_n$ is an electron diffusion length, $V_F$ is forward bias voltage, k is a Boltsmann's constant, T is an absolute temperature, $A_J$ is the sectional area of a metallurgical pn junction (A. S. Grove, "Physics and Technology of Semiconductor Devices," McGraw-Hill Book Company).

It can be seen from the expression (1) that current I or the number of moving electrons is inversely proportional to $N_A$ (acceptor impurity content). In other words, electrons easily move from n-type cathode region 1 to p-type anode region which has lower $N_A$ while electrons are less likely to flow from n-type cathode region 1 to p$^+$ buried layer 3 which has $N_A$ high enough to be able to practically ignore the inflow of electrons. It is because a high potential barrier is caused and a conduction band in the p-type semiconductor region becomes high at the junction interface between the n-type semiconductor region and the p-type semiconductor region having a high acceptor content. In the semiconductor device shown in FIGS. 1 and 2, therefore, application of positive voltage, relative to n-type cathode region 1, to p-type anode region 2 causes electrons to flow from n-type cathode region 1 only to p-type anode region 2, and the flow of electrons from n-type cathode region 1 directly to p substrate 4 can be prevented. As a result, the flow of electrons from p substrate 4 into a peripheral element can be prevented.

Since the acceptor content of the p-type anode region is not as high as that of the p$^+$ buried layer and the content is sufficiently low to cause the inflow of electrons, the slope (ΔI/ΔV) of forward bias current can be increased. Since the amount of electrons which flow toward the p$^+$ buried layer is small and most of them move to the p-type anode region, the controllability of a diode by anode voltage can be improved.

Second Embodiment

Figure 3:
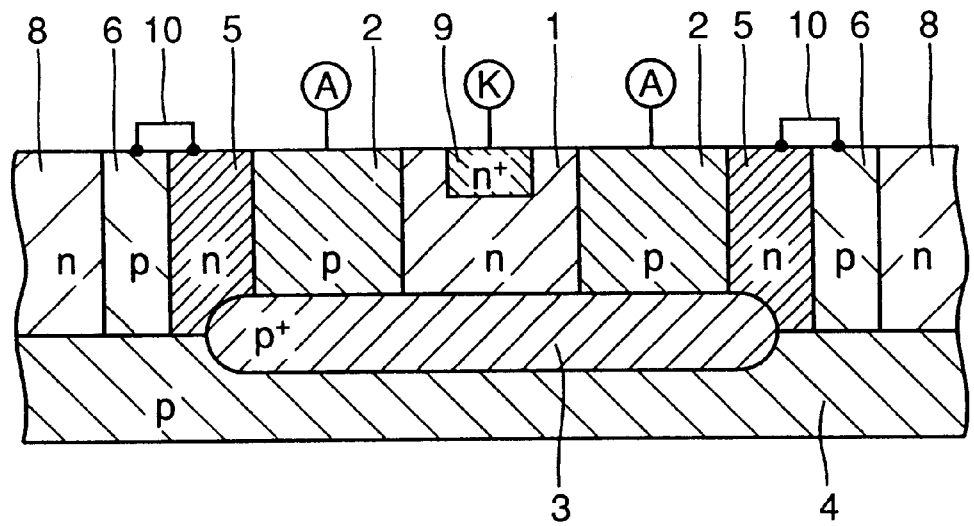
FIG. 3 is a sectional view of a semiconductor device in a second embodiment of the present invention.

A semiconductor device in a second embodiment shown in FIG. 3 is different from the first embodiment shown in FIGS. 1 and 2 in that an n-type semiconductor region (hereinafter, referred to as an "n region") 5 is formed around p-type anode region 2 and a p region 6 is formed around n region 5, which has an equal potential to that of n region 5. In the semiconductor device in this embodiment, application of positive voltage, relative to n-type cathode region 1, to p-type anode region 2 causes electrons to flow from n-type cathode region 1 to p-type anode region 2, and the probability of causing the flow of electrons into $p^+$ buried layer 3 is small.

The electrons which have flowed into p-type anode region 2 move to n region 5 due to the parasitic bipolar effect. Since n region 5 and p region 6 are connected by a wiring 10 so as to have an equal potential, the flow of electrons into n region 5 causes holes to be emitted from p region 6 for canceling the potential difference between n region 5 and p region 6. Thus, the electrons which have flowed from the p-type anode region into n region 5 recombine with the holes emitted from p region 6 and disappear. Therefore, the electrons which have flowed into p-type anode region 2 will not flow into semiconductor substrate 4.

A method of manufacturing the semiconductor device shown in FIG. 3 is as described in the following. By applying the semiconductor device manufacturing methods described herein and in a twenty-first embodiment, all the semiconductor devices in the embodiments of the present invention can be manufactured.

Figure 4:
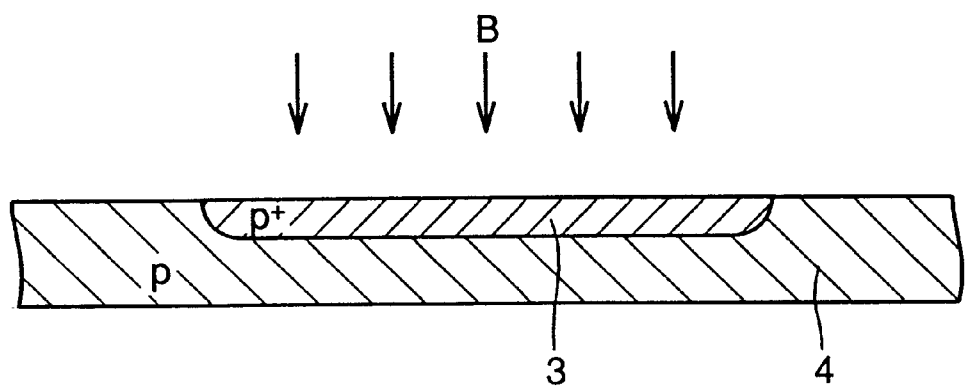
FIG. 4 is a sectional view of the semiconductor device of FIG. 3 after a buried layer is formed.

First, boron of about $10^{14}$ atoms/cm$^2$ is implanted into p substrate 4 with energy of 50 keV as shown in FIG. 4. Thereafter, annealing is performed at about 1000° C.

Figure 5:
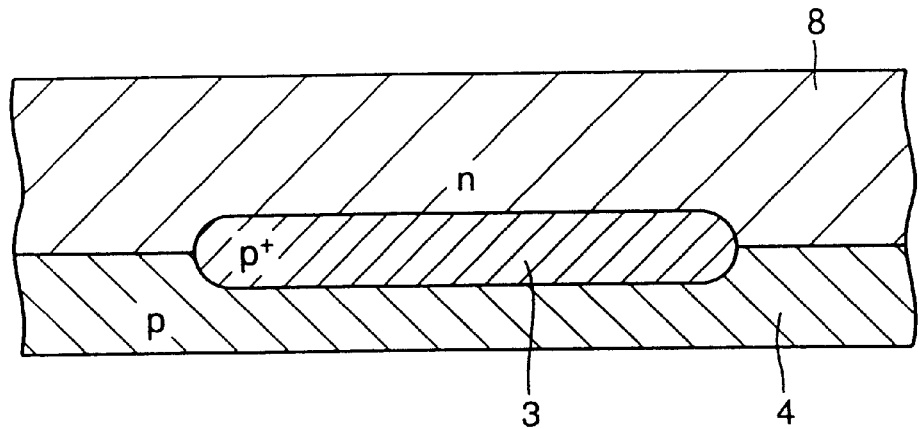
FIG. 5 is a sectional view of the semiconductor device of FIG. 3 after an n-type epitaxial layer is formed.

Then, an n-type silicon layer is epitaxially grown about 10 $\mu$m on the structure of FIG. 4 to form the structure shown in FIG. 5.

Figure 6:
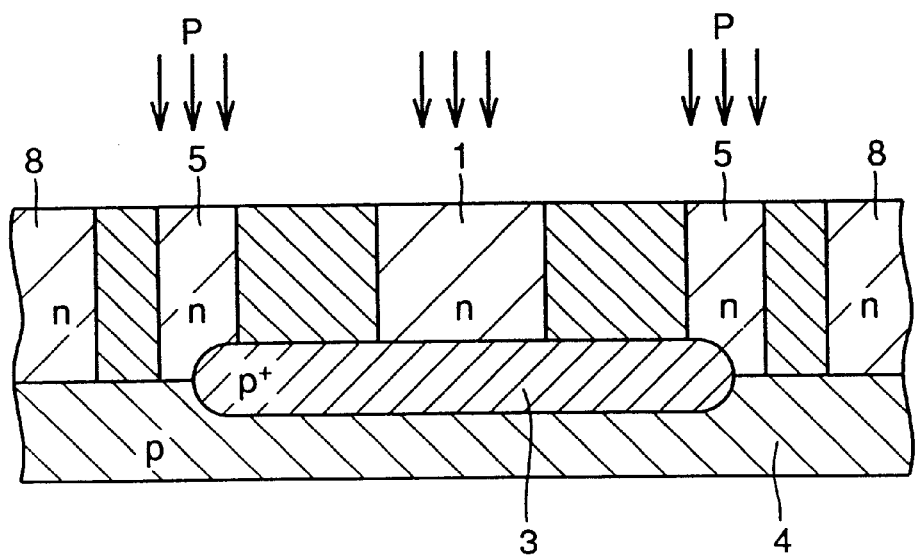
FIG. 6 is a sectional view of the semiconductor device of FIG. 3 after an n-type cathode region and an n region are formed.

As shown in FIG. 6, phosphorus of about $10^{12}$ atoms/cm$^2$ as impurities is then implanted with 100 to 200 keV and diffused by annealing into the portions of n-type cathode region 1 and n region 5 of the structure of FIG. 5.

Figure 7:
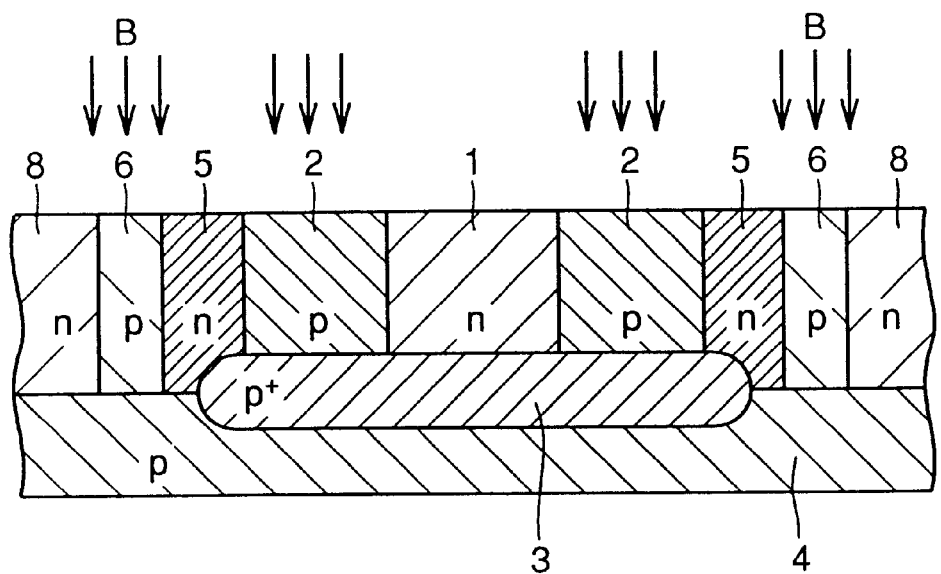
FIG. 7 is a sectional view of the semiconductor device of FIG. 3 after a p-type anode region and a p region are formed.

As shown in FIG. 7, boron of about $10^{13}$ atoms/cm$^2$ is then implanted with about 50 keV and diffused by annealing to form a p-type anode region and a p-type semiconductor region (p region).

Figure 8:
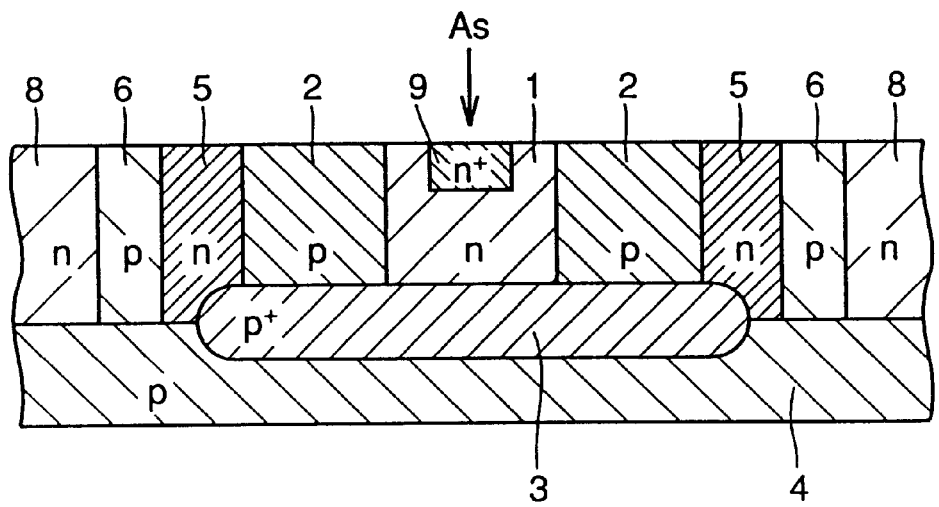
FIG. 8 is a sectional view of the semiconductor device of FIG. 3 after an n$^+$ region of a cathode electrode is formed.

As shown in FIG. 8, arsenic of about $10^{15}$ atoms/cm$^2$ as impurities is then implanted into an $n^+$ cathode region with 50 keV and diffused by annealing to form an $n^+$ region 9 of an electrode. Thus, the semiconductor device shown in FIG. 3 can be manufactured.

By using the above described semiconductor device, the flow of electrons into semiconductor substrate 4 can be prevented even in the case of forward bias where positive voltage relative to n-type cathode region 1 is applied to p-type anode region 2. Therefore, the flow of electrons from semiconductor substrate 4 to a peripheral element can be prevented, and a semiconductor device which can prevent a peripheral element malfunction can be obtained.

Since the acceptor content of the p-type anode region is not as high as that of the $p^+$ buried layer, the slope ($\Delta I/\Delta V$) of forward bias current can be increased. Since few electrons flow toward a region other than the p-type anode region at the time of forward bias, the controllability by anode voltage can be improved.

Third Embodiment

Figure 9:
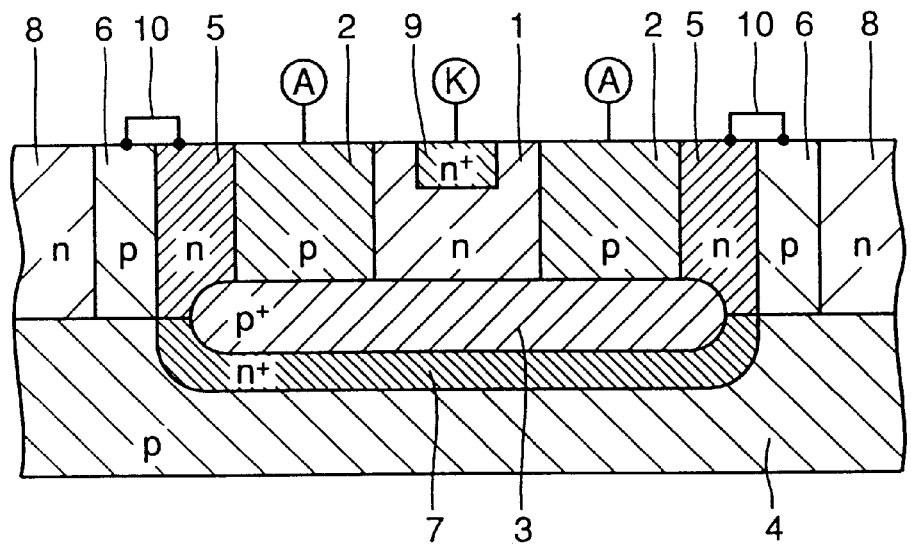
FIGS. 9 to 27 are sectional views of semiconductor devices in third to twenty-first embodiments of the present invention.

A semiconductor device in a third embodiment shown in FIG. 9 is different from the second embodiment (FIG. 3) in that an $n^+$ buried layer 7 is arranged under $p^+$ buried layer 3 and the $n^+$ buried layer is formed between $p^+$ buried layer 3 and semiconductor substrate 4. The peripheral portion of $n^+$ buried layer 7 is in contact with n region 5 and therefore it has an equal potential to that of p region 6.

In the semiconductor device, application of positive voltage, relative to n-type cathode region 1, to p-type anode region 2 causes electrons to flow from n-type cathode region 1 to p-type anode region 2, and the probability of causing the flow of electrons into p. buried layer 3 is small. Assuming that a very small amount of electrons attempt to flow into $p^+$ buried layer 3 and enter the semiconductor substrate, the electrons first move from $p^+$ buried layer 3 to $n^+$ buried layer 7. When the electrons flow into $n^+$ buried layer 7, negative bias voltage is applied to $n^+$ buried layer 7, causing a potential difference from p region 6. Since the condition of an equal potential is imposed on $n^+$ buried layer 7, n region 5 and p region 6, holes are emitted from p region 6. The electrons recombine with the holes and disappear.

Meanwhile, electrons which have flowed from p-type anode region 2 through $p^+$ buried layer 3 to $n^+$ buried layer 7 also recombine with holes emitted from p region 6 and disappear. Therefore, electrons will not flow to p substrate 4 via $n^+$ buried layer 7. As described in the second embodiment, the lateral flow of electrons bypassing the buried layers is stopped by n region 5 and p region 6 which have the condition of an equal potential.

Therefore, the flow of electrons toward semiconductor substrate 4 can be prevented and thus the flow of electrons from p substrate 4 into a peripheral element is eliminated. As a result, it is possible to prevent a peripheral element malfunction.

Since the acceptor content of the p-type anode region is not as high as that of the $p^+$ buried layer, the slope ($\Delta I/\Delta V$) of forward bias current can be increased. Since few electrons flow toward a region other than the p-type anode region at the time of forward bias, the controllability by anode voltage can be improved.

Figure 24:
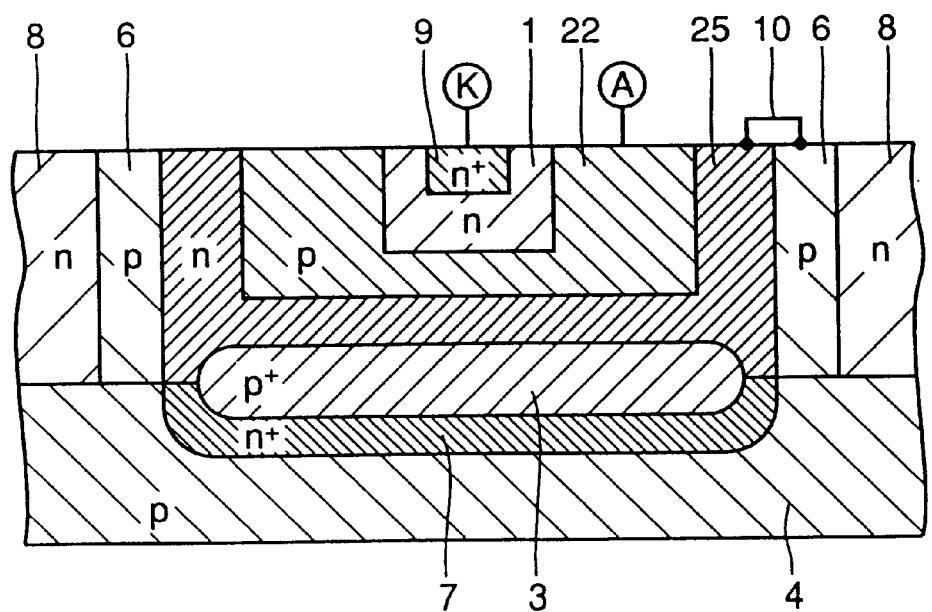

In FIG. 9, the donor content of $n^+$ buried layer 7 provided in contact with the bottom surface of $p^+$ buried layer 3 is made higher than that of n region 5. However, the donor content of $n^+$ buried layer 7 may be lower than or equal to that of n region 5. The same applies to the buried layer of each semiconductor device in the sixth embodiment (FIG. 12), the eleventh embodiment (FIG. 17), the fourteenth embodiment (FIG. 20), and the eighteenth embodiment (FIG. 24).

Fourth Embodiment

Figure 10:
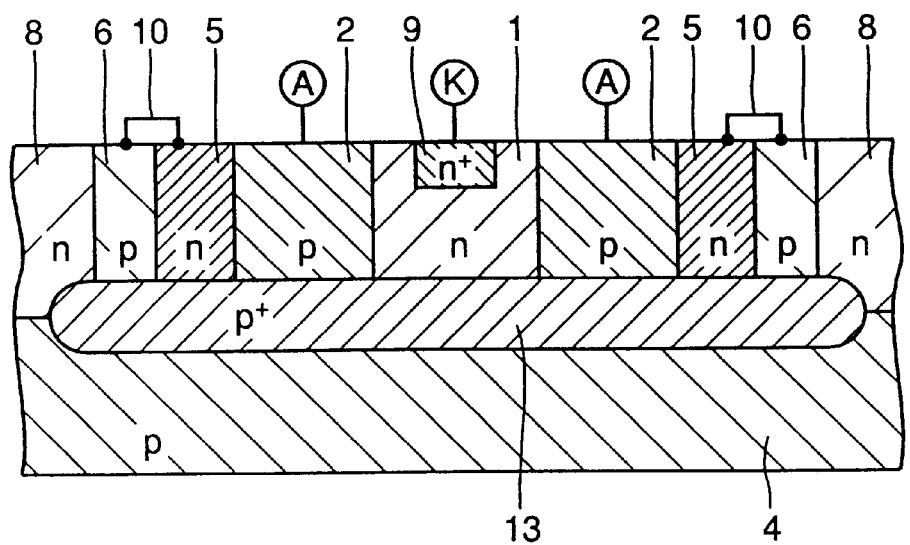

A semiconductor device in a fourth embodiment shown in FIG. 10 is different from the second embodiment (FIG. 3) in that n region 5 and region 6 are both formed on a $p^+$ buried layer 13. In the first embodiment, the acceptor content is not high at a deep portion of p region 6 (at a portion in contact with semiconductor substrate 4). Thus, electrons which have moved from p-type anode region 2 to n region 5 easily move to the deep portion of p region 6 and may enter p substrate 4. In the fourth embodiment, however, the deep portion of p region 6 is in contact with $p^+$ buried layer 13, and therefore the acceptor content is not low. Electrons which have moved to n region 5 will not move to p region 6 and enter semiconductor substrate 4 as shown in the expression (1). Therefore, a peripheral element malfunction caused by the inflow of electrons through semiconductor substrate 4 can be prevented.

Since the acceptor content of the p-type anode region is not as high as that of the $p^+$ buried layer, the slope ($\Delta I/\Delta V$) of forward bias current can be increased. Since few electrons flow toward a region other than the p-type anode region at the time of forward biasing, the controllability by anode voltage can be improved.

Fifth Embodiment

Figure 11:
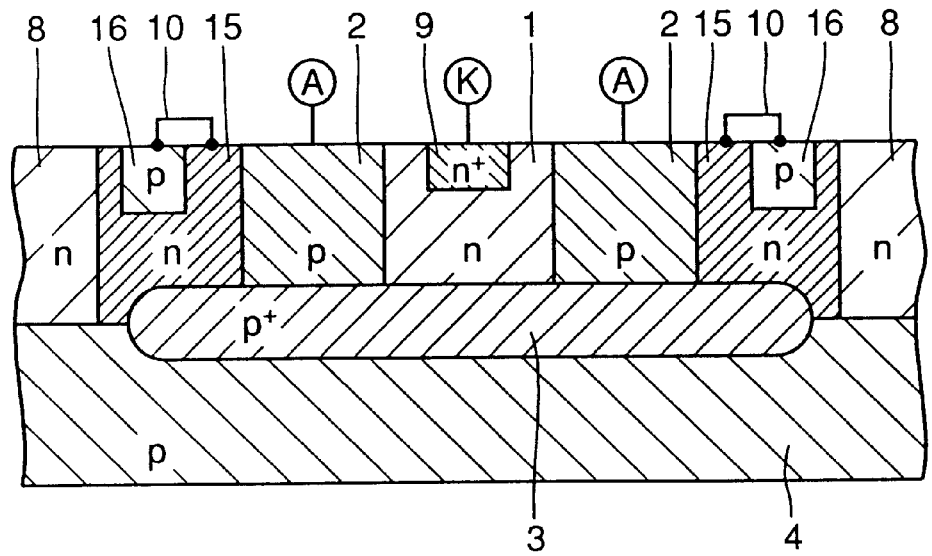

A semiconductor device in a fifth embodiment shown in FIG. 11 is different from the second embodiment (FIG. 3) in that a p region 16 is formed in an n region 15. By adopting such a structure, the semiconductor device can be made smaller compared with the second embodiment, and a peripheral element malfunction caused by the inflow of electrons through semiconductor substrate 4 can be prevented.

Further, the slope ($\Delta I/\Delta V$) of forward bias current can be increased, and the controllability by anode voltage can be improved.

Sixth Embodiment

Figure 12:
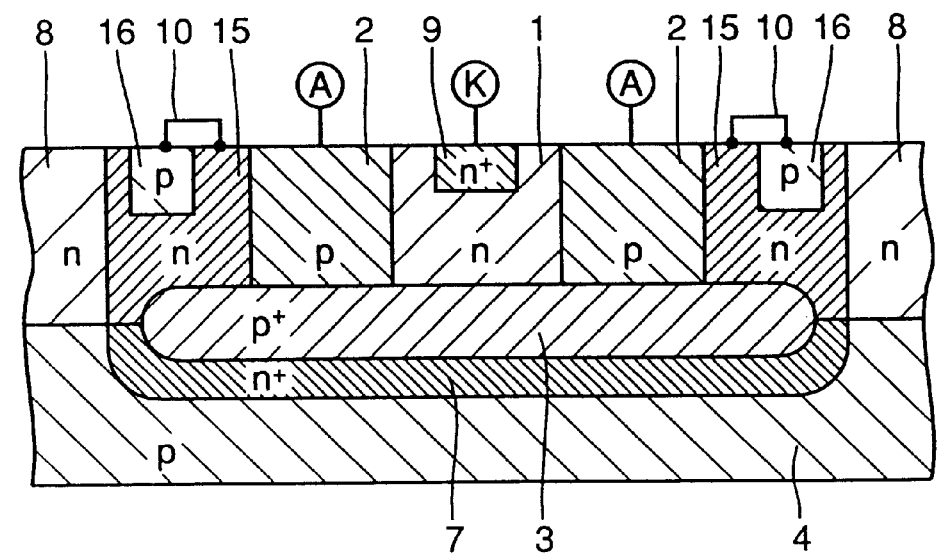

A semiconductor device in a sixth embodiment shown in FIG. 12 is different from the third embodiment (FIG. 9) in that p region 16 is formed in n region 15 to overlap n region 15. By adopting such a structure, them semiconductor device can be made smaller, and the flow of electrons into semiconductor device 4 can be prevented.

Seventh Embodiment

A semiconductor device in a seventh embodiment shown in FIG. 7 is different from the fourth embodiment (FIG. 10) in that p region 16 is formed in n region 15. According to such a structure, the semiconductor device can be made smaller compared with the fourth embodiment, and a peripheral element malfunction can me eliminated by preventing the flow of electrons into the semiconductor substrate.

Eighth Embodiment

A semiconductor device in an eighth embodiment shown in FIG. 8 is different from the fourth embodiment (FIG. 10) in that not all the p region 6 is formed on a $p^+$ buried layer 23. Even if both n region 5 and p region 6 cannot be formed on $p^+$ buried layer 13 unlike the forth embodiment, substantially the same effects as the fourth embodiment (FIG. 10) can be attained and a malfunction of peripheral elements can be prevented by adopting the structure in the eighth embodiment.

Ninth Embodiment

Figure 15:
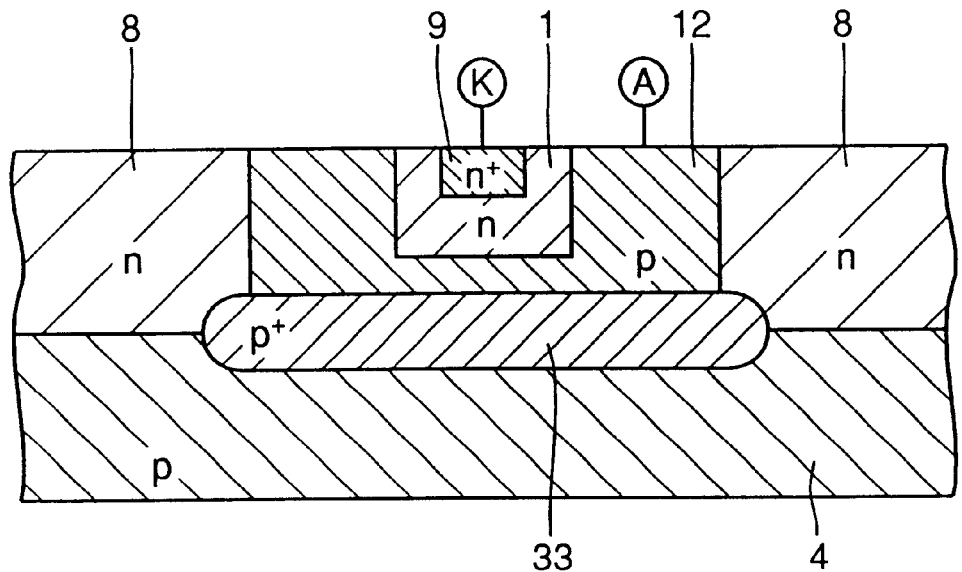

A semiconductor device in a ninth embodiment shown in FIG. 15 is different from the first embodiment (FIGS. 1 and 2) in that n-type cathode region 1 is formed in a p-type anode region 12. By adopting the structure, the semiconductor device can further be miniaturized, and a peripheral element malfunction caused by the inflow of electrons from semiconductor substrate 4 can be prevented.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

In order to manufacture the semiconductor device which has the p-type anode region, the n region or the p region formed immediately under the bottom surface of the n-type cathode region as shown in FIG. 15, an impurity region is formed in advance under the n-type cathode region. The detailed manufacturing method will be described in a twenty-first embodiment.

Tenth Embodiment

Figure 16:
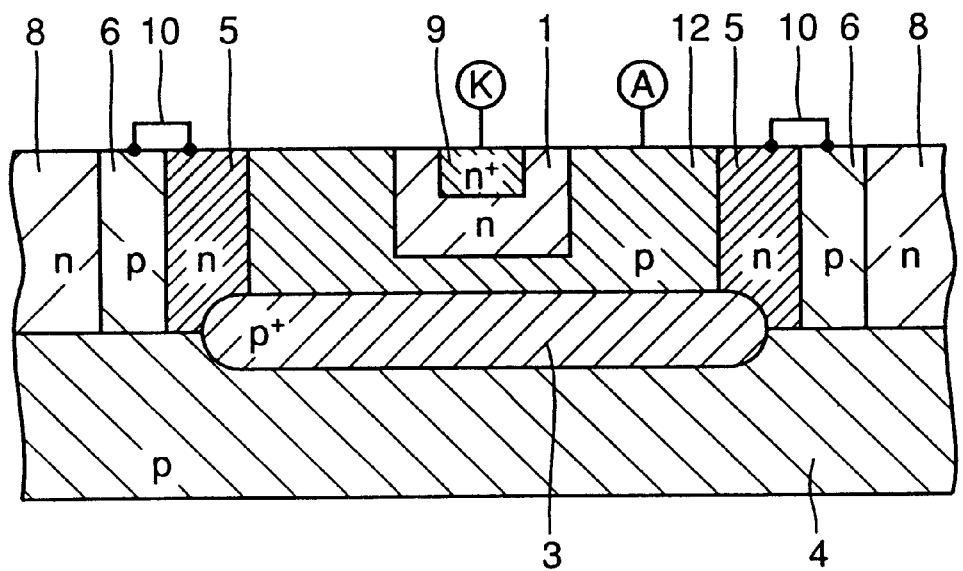

A semiconductor device in a tenth embodiment shown in FIG. 16 is different from the second embodiment (FIG. 3) in that n-type cathode region 1 is formed in p-type anode region 12. According to such a structure, the semiconductor device can be miniaturized, and a peripheral element malfunction can be eliminated by preventing the flow of electrons into semiconductor substrate 4.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

Eleventh Embodiment

Figure 17:
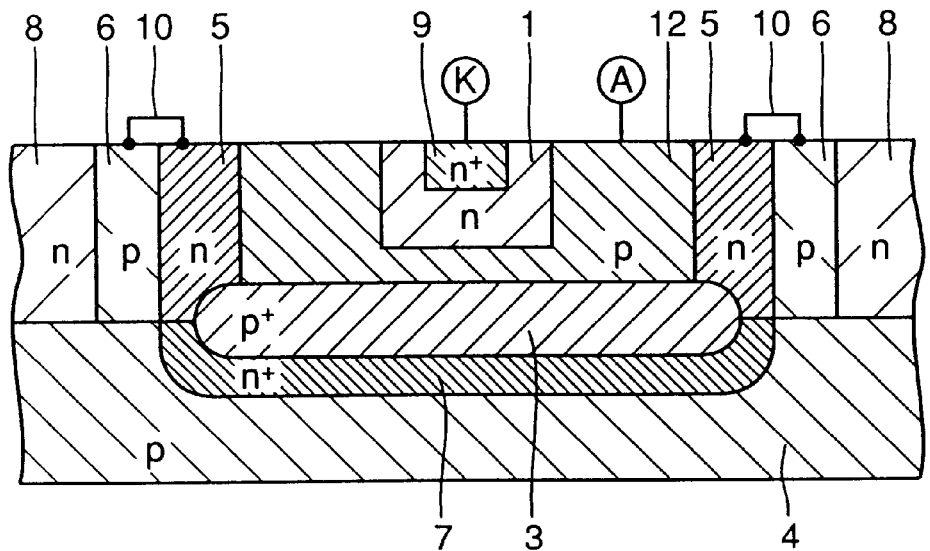

A semiconductor device in an eleventh embodiment shown in FIG. 17 is different from the third embodiment (FIG. 9) in that n-type cathode region 1 is formed in p-type anode region 12. According to such a structure, the semiconductor device can be miniaturized, and a peripheral element malfunction can be eliminated by preventing the flow of electrons into semiconductor substrate 4.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

Twelfth Embodiment

Figure 18:
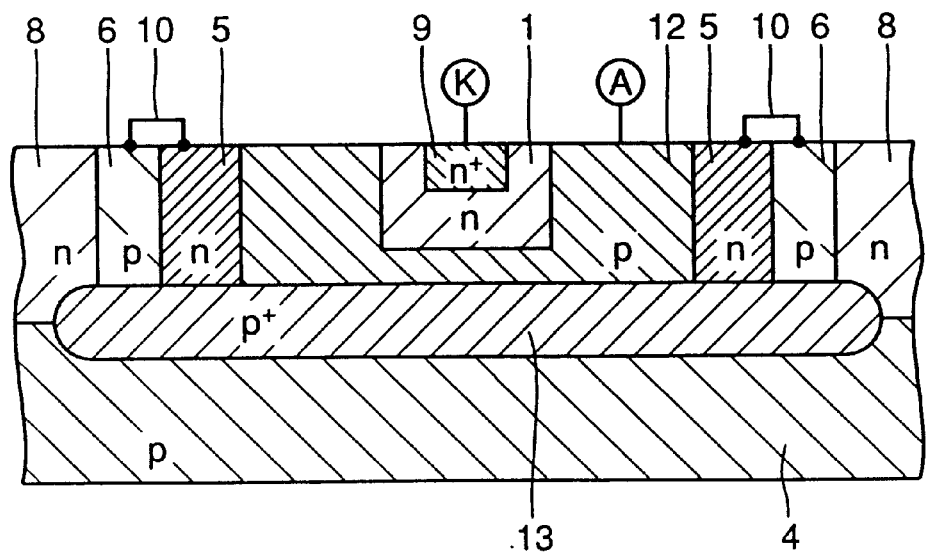

A semiconductor device in a twelfth embodiment shown in FIG. 18 is different from the fourth embodiment (FIG. 10) in that n-type cathode region 1 is formed in p-type anode region 12. According to such a structure, the semiconductor device can be made smaller compared with the fourth embodiment, and a peripheral element malfunction can be eliminated by preventing the flow of electrons into semiconductor device 4.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

Thirteenth Embodiment

Figure 19:
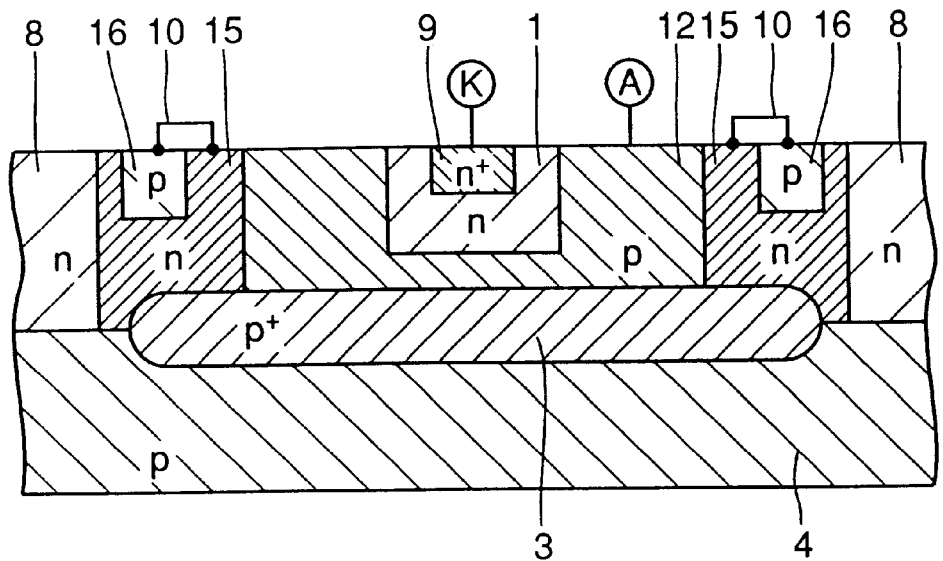

A semiconductor device in a thirteenth embodiment shown in FIG. 19 is different from the fifth embodiment (FIG. 11) in that n-type cathode region 1 is formed in p-type anode region 12 and p region 16 is formed in n region 15. According to such a structure, the semiconductor device can be miniaturized more compared with the fifth embodiment (FIG. 11), and a peripheral element malfunction can be eliminated by preventing the flow of electrons into semiconductor substrate 4.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

Fourteenth Embodiment

Figure 20:
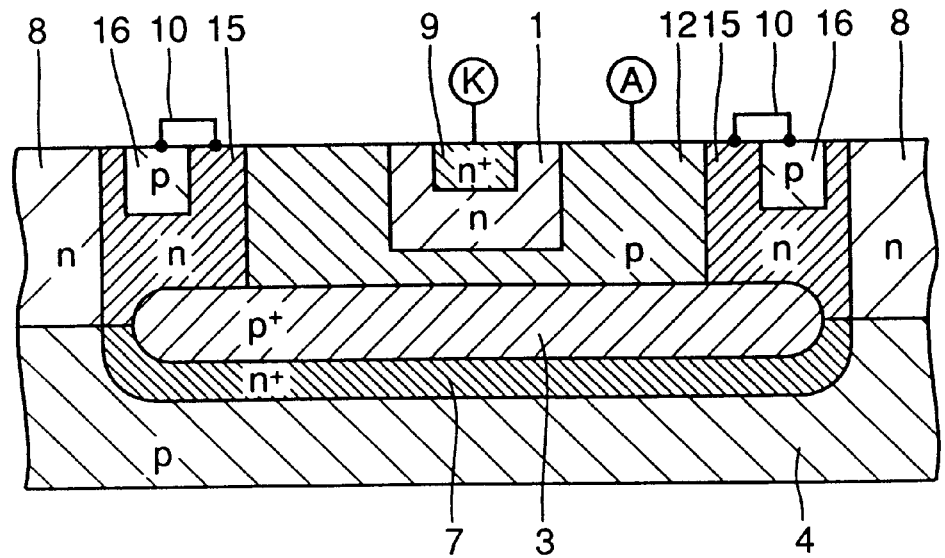

A semiconductor device in a fourteenth embodiment shown in FIG. 20 is different from the sixth embodiment (FIG. 12) in that n-type cathode region 1 is formed in p-type anode region 12. In both of the embodiments, p region 16 is formed in n region 15. According to such a structure, the semiconductor device can be miniaturized more compared with the fifth embodiment, and a peripheral element malfunction can be eliminated by preventing the flow of electrons into semiconductor substrate 4.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

Fifteenth Embodiment

Figure 13:
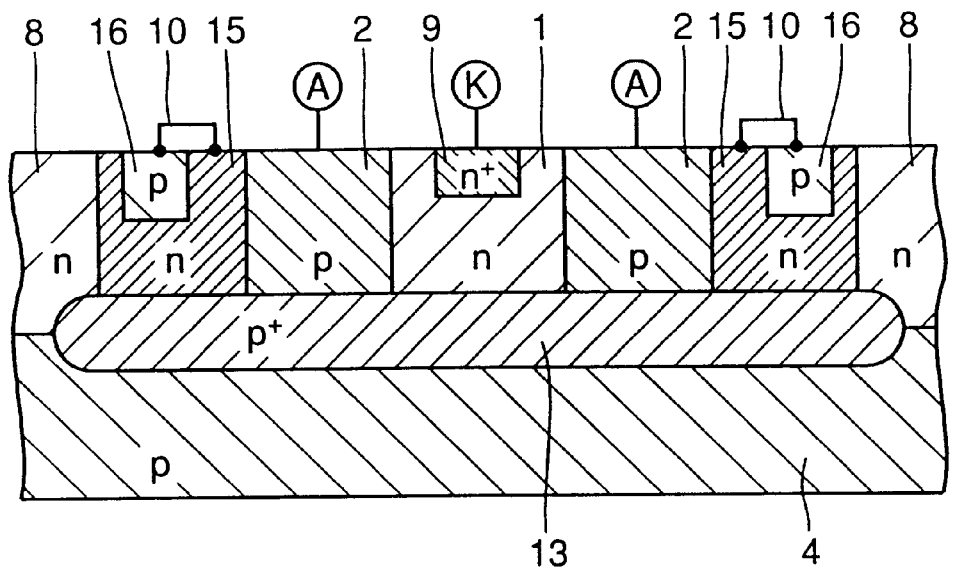
Figure 21:
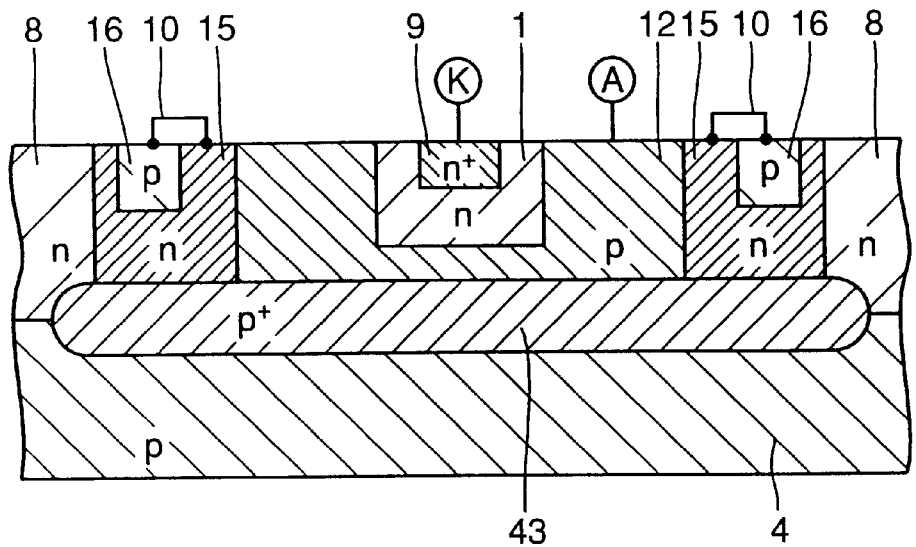

A semiconductor device in a fifteenth embodiment shown in FIG. 21 is different from the seventh embodiment (FIG. 13) in that n-type cathode region 1 is formed in p-type anode region 12. In both of the embodiments, p region 16 is formed inside n region 15. According to such a structure, the semiconductor device can be made smaller compared with the seventh embodiment, and a peripheral element malfunction can be eliminated by preventing the flow of electrons into semiconductor substrate 4.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

Sixteenth Embodiment

Figure 14:
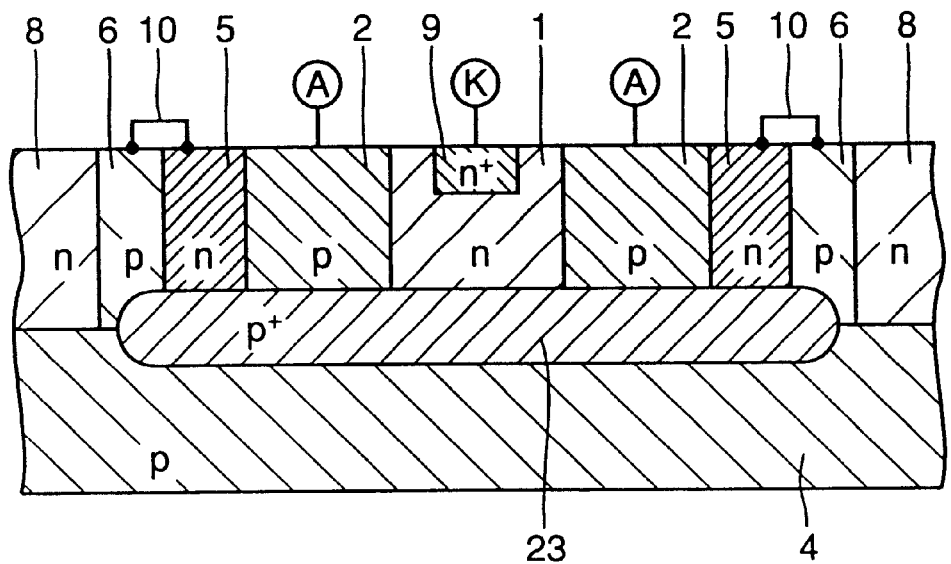
Figure 22:
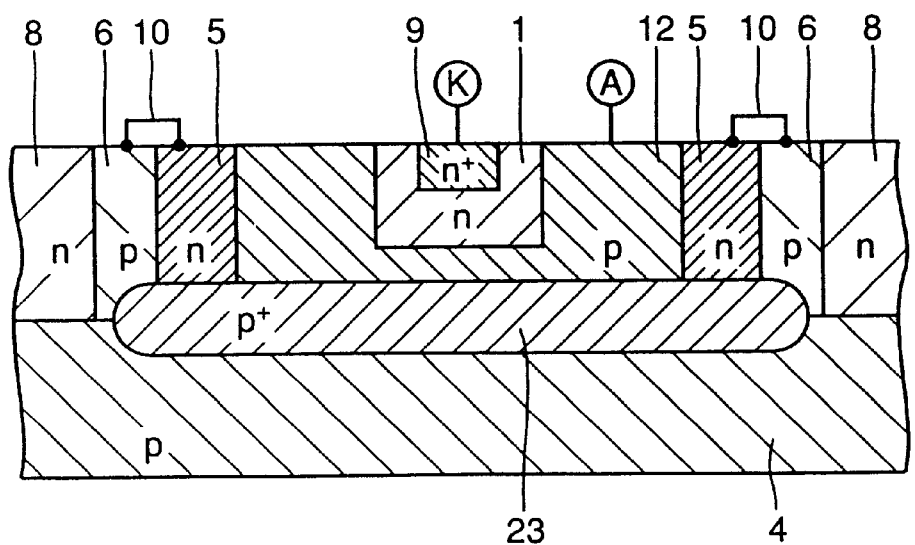

A semiconductor device in a sixteenth embodiment shown in FIG. 22 is different from the eighth embodiment (FIG. 14) in that n-type cathode region 1 is formed inside p-type anode region 12. According to such a structure, the semiconductor device can be miniaturized more compared with the eighth embodiment, and a peripheral element malfunction can be eliminated by preventing the flow of electrons into semiconductor substrate 4.

Since the acceptor content of the p-type anode region is not as high as that of the $p^+$ buried layer and the p-type anode region is also in contact with the bottom surface of the n-type cathode region, the slope ($\Delta I/\Delta V$) of forward bias current can further be increased. Since few electrons move toward a region other than the p-type anode region at the time of forward bias, the controllability by anode voltage can further be improved.

Seventeenth Embodiment

Figure 23:
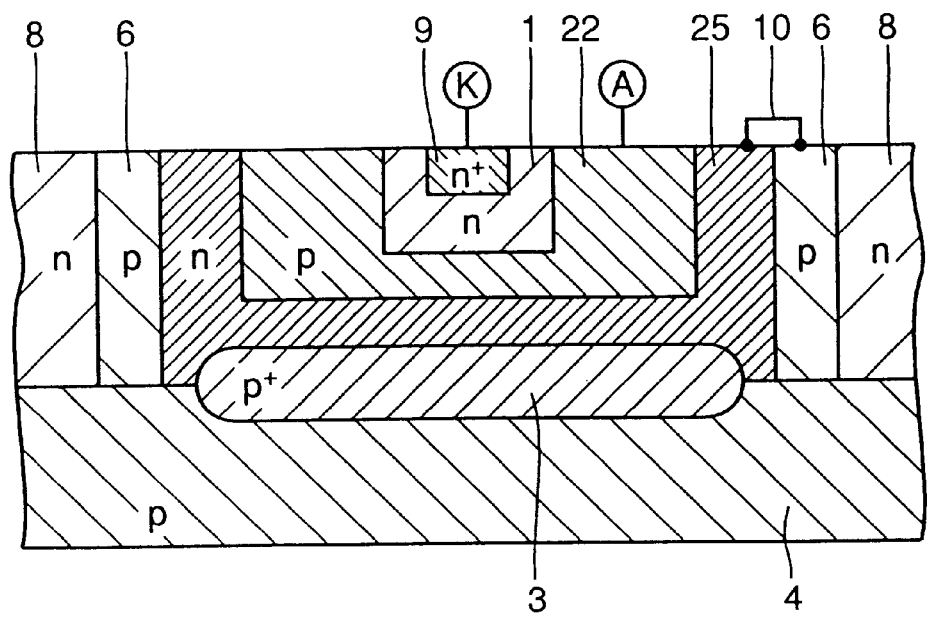

A semiconductor device in a seventeenth embodiment shown in FIG. 23 is different from the tenth embodiment (FIG. 16) in that a p-type anode region 22 is formed inside an n region 25. According to such a structure, the semiconductor device can be miniaturized more compared with the tenth embodiment, and a peripheral element malfunction can be eliminated by preventing the flow of electrons into semiconductor substrate 4.

Eighteenth Embodiment

A semiconductor device in an eighteenth embodiment shown in FIG. 24 is different from the eleventh embodiment (FIG. 17) in that p-type anode region 22 is formed in n region 25. According to such a structure, the semiconductor device can be made smaller compared with the eleventh embodiment, and a peripheral element malfunction can be eliminated by preventing the flow of electrons into semiconductor substrate 4.

Nineteenth Embodiment

Figure 25:
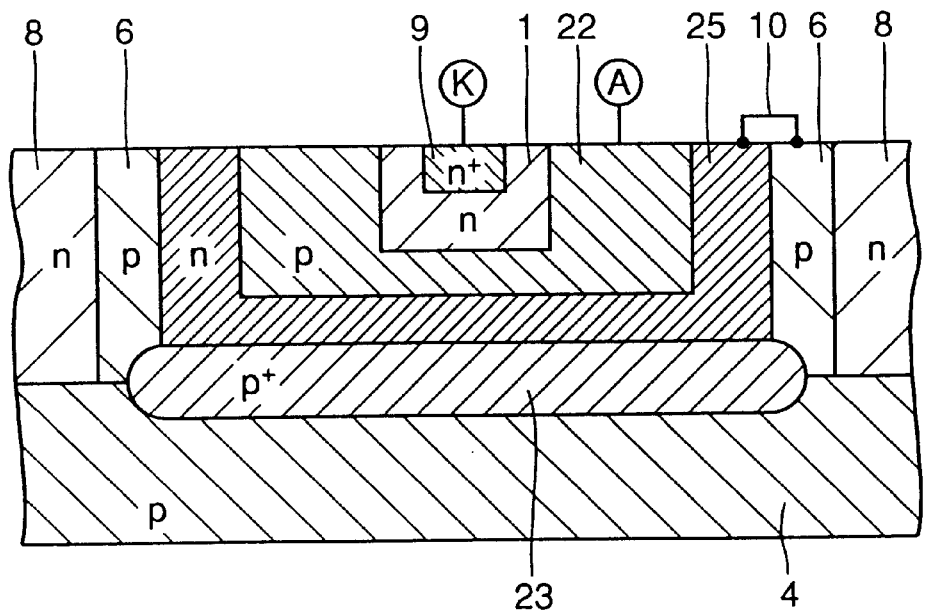

A semiconductor device in a nineteenth embodiment shown in FIG. 25 is different from the sixteenth embodiment (FIG. 22) in that p-type anode region 22 is formed in n region 25. According to such a structure, the semiconductor device can be made smaller compared with the sixteenth embodiment, and a peripheral element malfunction can be eliminated by preventing the flow of electrons into semiconductor substrate 4.

Twentieth Embodiment

Figure 26:
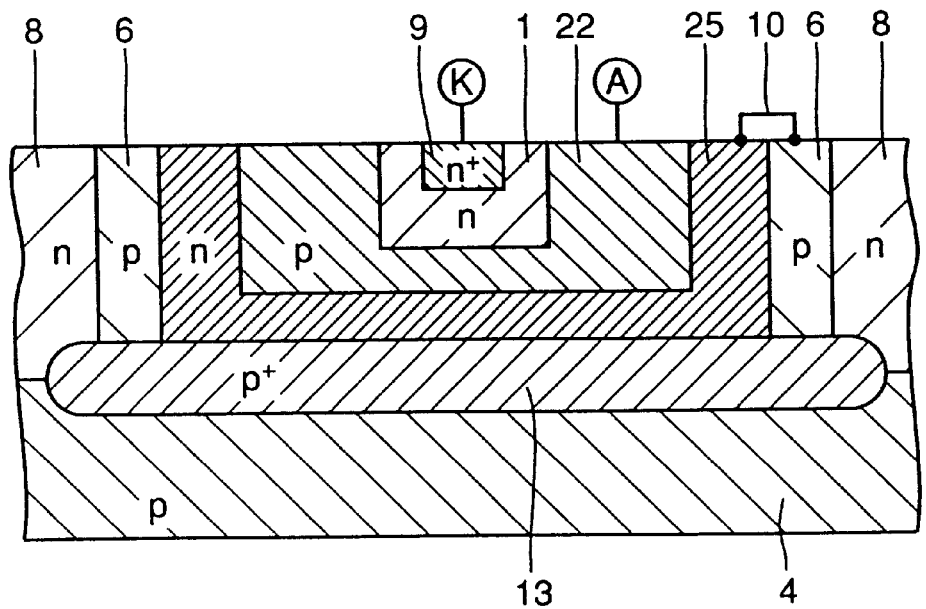

A semiconductor device in a twentieth embodiment shown in FIG. 26 is different from the twelfth embodiment (FIG. 18) in that p-type anode region 22 is formed in n region 25. According to such a structure, the semiconductor device can be miniaturized more compared with the twelfth embodiment, and a peripheral element malfunction can be eliminated by preventing the flow of electrons into semiconductor substrate 4.

Twenty-First Embodiment

Figure 27:
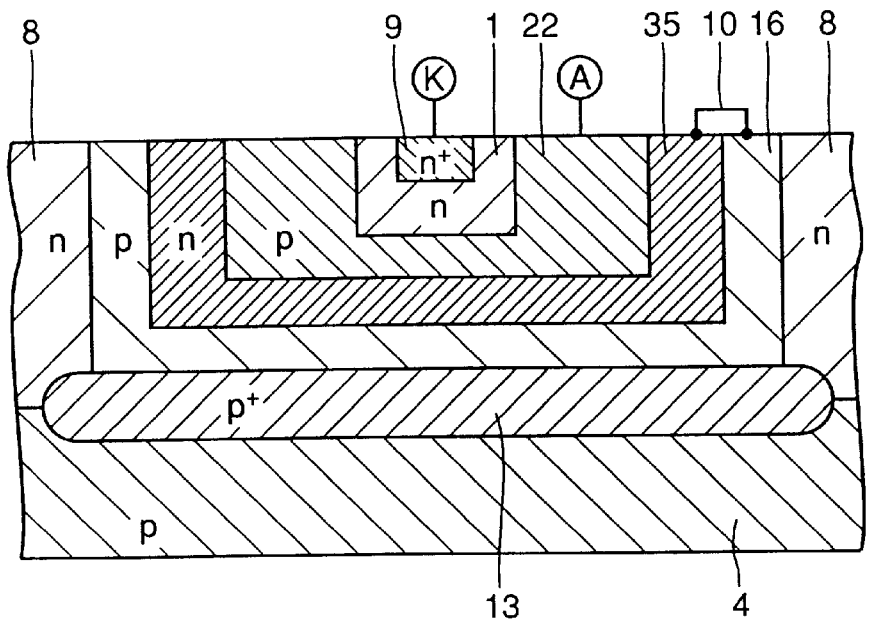

A semiconductor device in a twenty-first embodiment shown in FIG. 27 is different from the twentieth embodiment (FIG. 26) in that an n region 35 is formed in p region 16.

A method of manufacturing the semiconductor device in the twenty-first embodiment will be described. The method is the same as the method described in the second embodiment till the step of forming an n-type epitaxial layer (FIG. 5).

Figure 28:
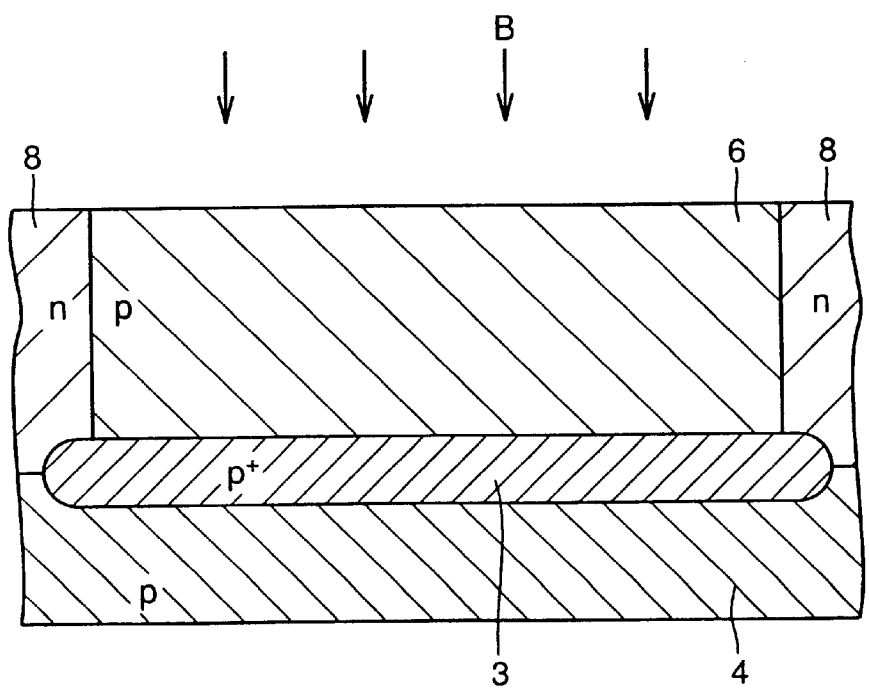
FIG. 28 is a sectional view of the semiconductor device of FIG. 27 after a p region is formed.

As shown in FIG. 28, a p region is then formed on the structure shown in FIG. 5 by implanting boron with a sufficient diameter and diffusing it to the boundary with the p substrate.

Figure 29:
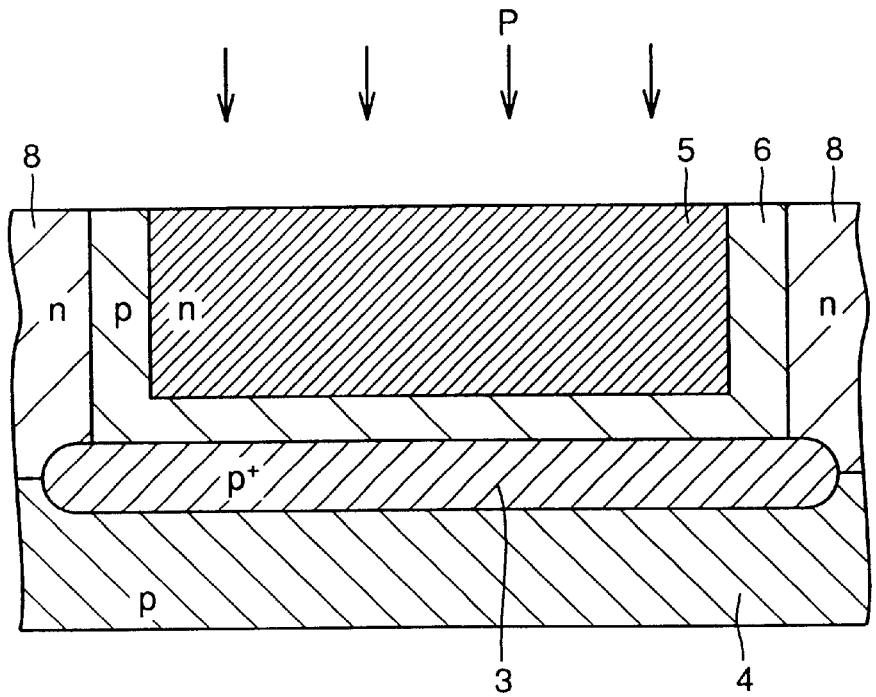
FIG. 29 is a sectional view of the semiconductor device of FIG. 27 after an n region in the p region is formed.

An n region is then formed by implanting phosphorus with a smaller diameter than the p region and diffusing it to a depth higher than $p^+$ buried layer by a prescribed distance (FIG. 29).

Figure 30:
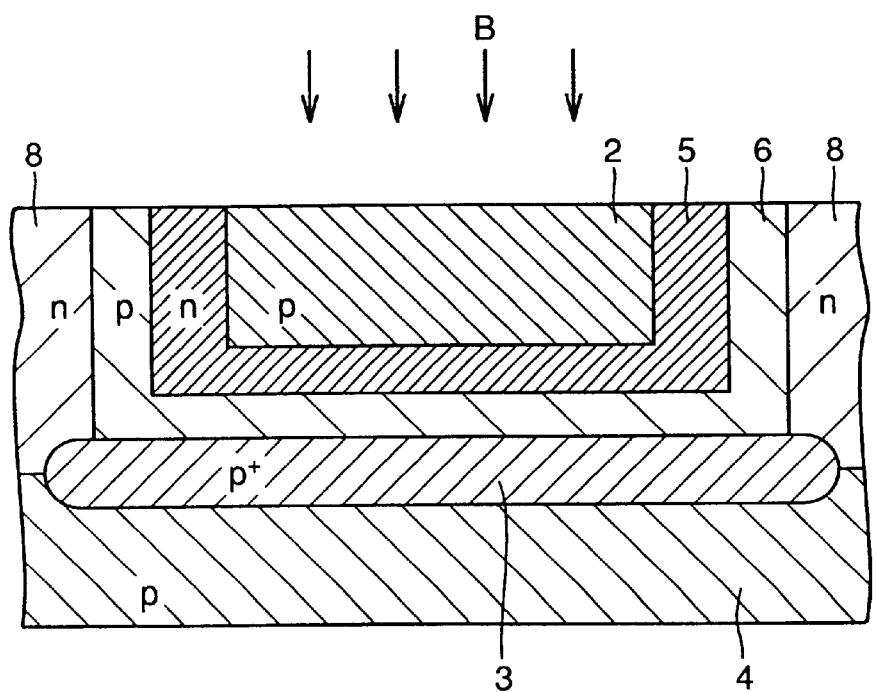
FIG. 30 is a sectional view of the semiconductor device of FIG. 27 after a p-type anode region in the n region is formed.

A p-type anode region is then formed as shown in FIG. 30 by implanting boron with a smaller diameter than the n region shown in FIG. 29 and diffusing it to a depth higher than the bottom of the n region by a prescribed distance.

Figure 31:
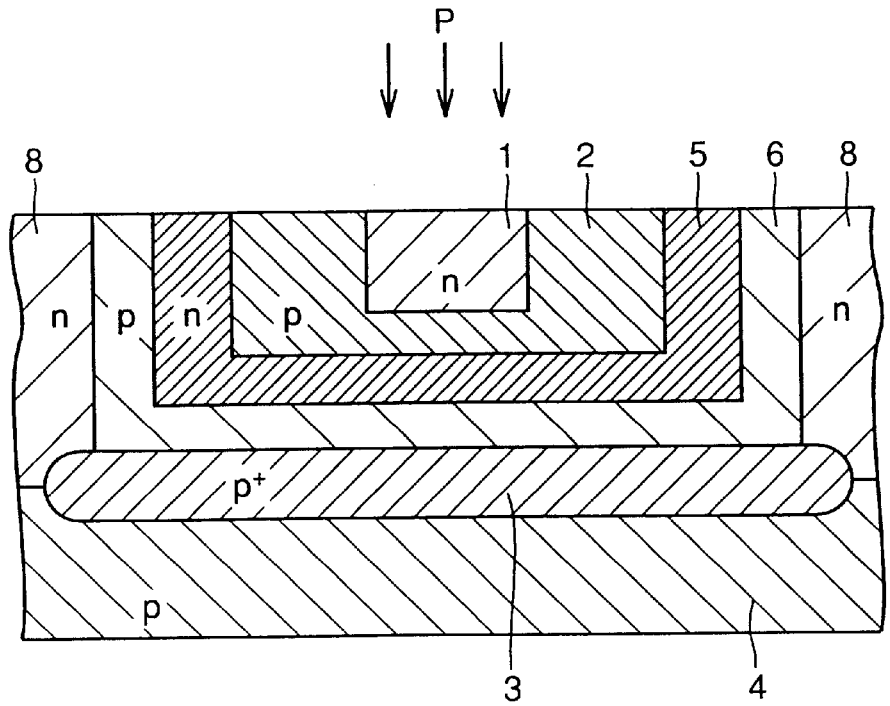
FIG. 31 is a sectional view of the semiconductor device of FIG. 27 after an n-type cathode region in the p-type anode region is formed.

Then, an n-type cathode region is formed by implanting phosphorus with a smaller diameter than the p-type anode region shown in FIG. 30 and diffusing it to a depth higher than the bottom of the p-type anode region by a prescribed distance (FIG. 31).

Figure 32:
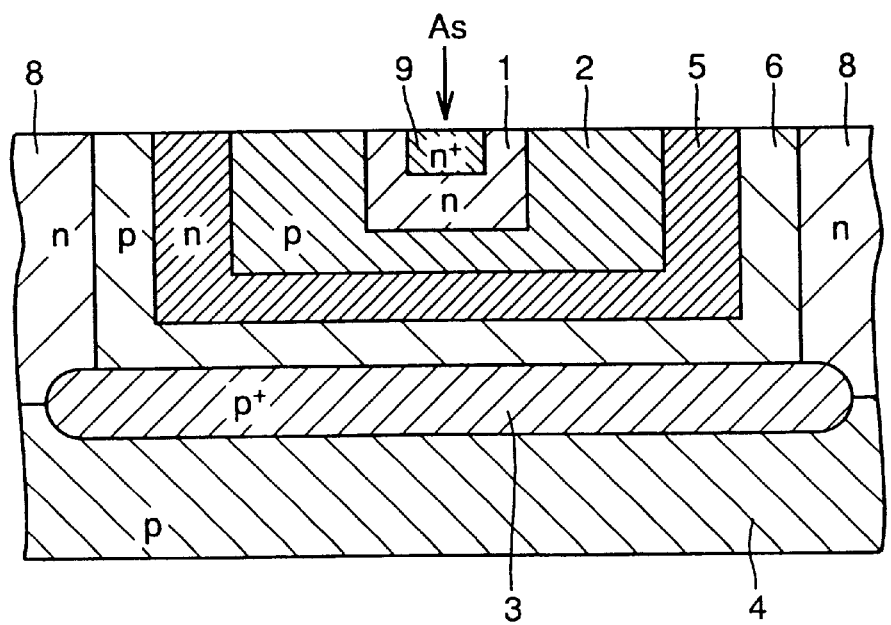
FIG. 32 is a sectional view of the semiconductor device of FIG. 27 after an n$^+$ cathode region is formed.

Thereafter, an $n^+$ cathode region is formed by implanting and diffusing arsenic (FIG. 32).

By adopting such a structure, the semiconductor device can be miniaturized more compared with the nineteenth embodiment, and a peripheral element malfunction can be eliminated by preventing the flow of electrons into semiconductor substrate 4.

Twenty-Second Embodiment

Figure 33:
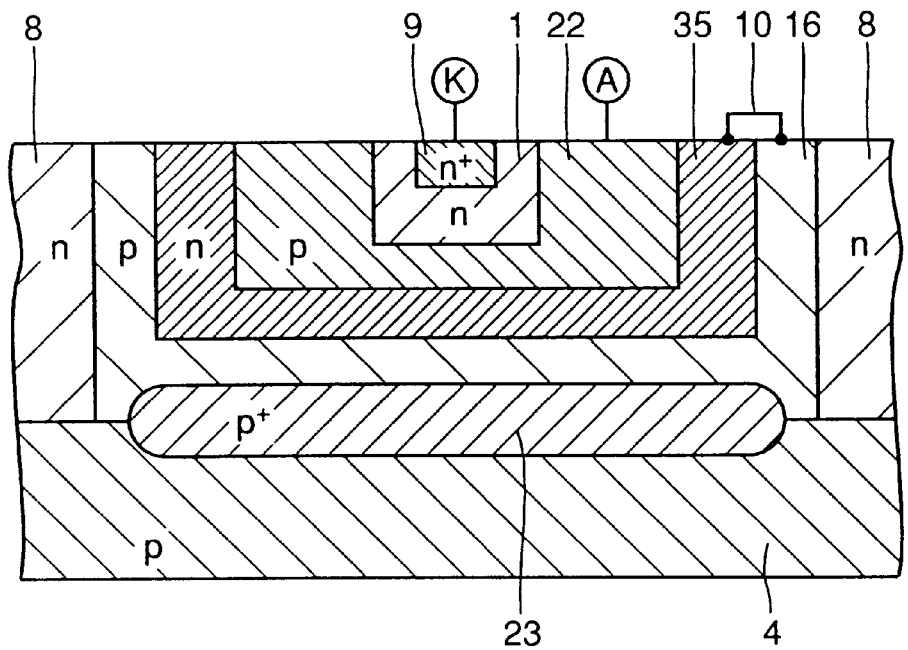
FIG. 33 is a sectional view of a semiconductor device in a twenty-second embodiment of the present invention.
Figure 34:
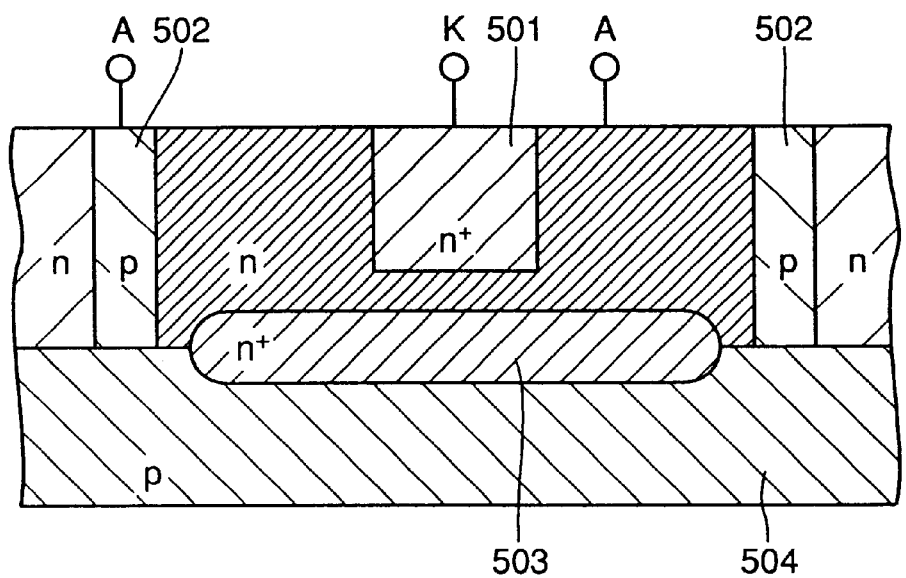
FIG. 34 is a sectional view showing a conventional semiconductor device.
Figure 35:
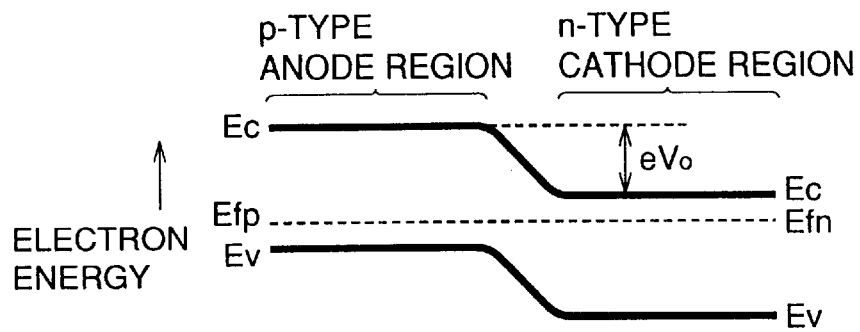
FIG. 35 is an energy band chart of the conventional semiconductor device.
Figure 36:
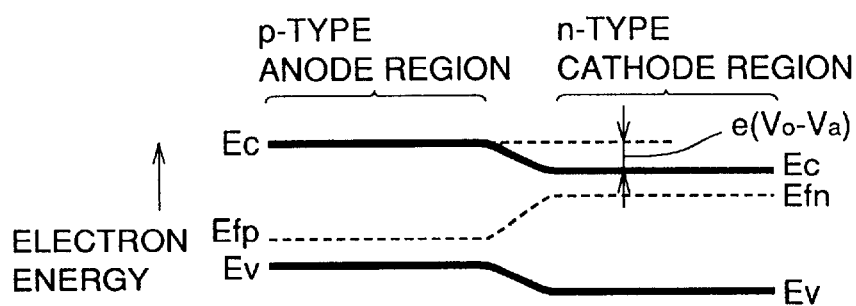
FIG. 36 is an energy band chart when forward bias is applied to the conventional semiconductor device.
Figure 37:
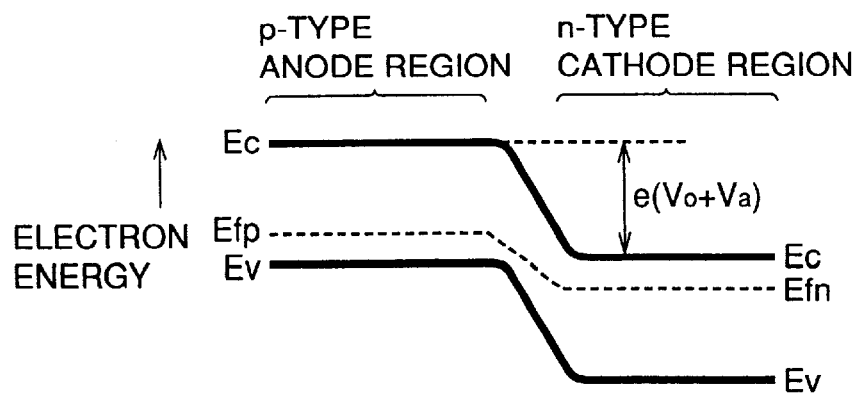
FIG. 37 is an energy band chart when reverse bias is applied to the conventional semiconductor device.

A semiconductor device in a twenty-second embodiment shown in FIG. 33 is different from the nineteenth embodiment (FIG. 25) in that n region 35 is formed in region 16. According to such a structure, the semiconductor device can be miniaturized more compared with the nineteenth embodiment, and a peripheral element malfunction can be eliminated by preventing the flow of electrons into semiconductor substrate 4.

Although a p-type semiconductor substrate is used in all the embodiments, the semiconductor substrate is not limited to the p-type substrate. According to application, an n-type semiconductor substrate or an intrinsic semiconductor substrate can be employed. In the semiconductor device, a cathode region is surrounded by an anode region and has a circular plan shape as shown in FIG. 1. However, the cathode region is not limited to the circular shape but it may be rectangular, oval and the like according to application. Therefore, the anode region, n and p regions which surround the inner regions may be rectangular cylindrical, oval cylindrical and so on.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device containing a diode comprising:
   a p-type buried semiconductor layer provided at a main surface of a semiconductor substrate;
   a cathode region formed of an n-type semiconductor layer provided on said p-type buried semiconductor layer; and
   an anode region formed of a p-type semiconductor layer formed to surround and be in contact with a side surface of said cathode region,
   said p-type buried semiconductor layer being higher than said anode region in acceptor content, and
   said p-type buried semiconductor layer being in electrical contact with bottom surfaces of said cathode region and said anode region.

2. The semiconductor device according to claim 1, wherein the acceptor content of said p-type buried semiconductor layer is high enough to be able to practically ignore inflow of electrons emitted from the cathode region.

3. The semiconductor device according to claim 1, wherein said anode region extends on the bottom surface of said cathode region to cover the bottom surface of said cathode region, and the entire bottom surface of said anode region is in contact with said p-type buried semiconductor layer.

4. A semiconductor device, comprising:
   a p-type buried semiconductor layer provided at a main surface of a semiconductor substrate;
   a cathode region formed of an n-type semiconductor layer provided on said p-type buried semiconductor layer;
   an anode region formed of a p-type semiconductor layer formed to surround and be in contact with a side surface of said cathode region,
   said p-type buried semiconductor layer being higher than said anode region in acceptor content, and
   said p-type buried semiconductor layer being in electrical contact with bottom surfaces of said cathode region and said anode region;
   an n-type semiconductor region surrounding and being in contact with an outer side surface of said anode region; and
   a p-type semiconductor region being in contact with said n-type semiconductor region along a circumferential direction and at an equal potential to said n-type semiconductor region, wherein
   said p-type buried semiconductor layer having width and arrangement which cause the layer to be in contact at least with the entire bottom surfaces of said cathode region and said anode region.

5. The semiconductor device according to claim 4, wherein said anode region extends on the bottom surface of said cathode region to cover the bottom surface of said cathode region.

6. The semiconductor device according to claim 5, wherein said n-type semiconductor region extends on the bottom surface of said anode region to cover the bottom surface of said anode region.

7. The semiconductor device according to claim 6, wherein said p-type semiconductor region extends on the bottom surface of said n-type semiconductor region to cover the bottom surface of said n-type semiconductor region.

8. The semiconductor device according to claim 4, wherein said p-type semiconductor region is formed so as to overlap said n-type semiconductor region in plan view.

9. The semiconductor device according to claim 4, further comprising:
   an n-type buried semiconductor layer formed in said substrate to surround and be in contact with side and bottom surfaces of said p-type buried semiconductor layer in said substrate, said n-type buried semiconductor layer extending on the bottom surface of said n-type semiconductor region.

* * * * *